US008861284B2

(12) United States Patent
Bunce et al.

(10) Patent No.: US 8,861,284 B2
(45) Date of Patent: Oct. 14, 2014

(54) INCREASING MEMORY OPERATING FREQUENCY (71) Applicant: International Business Machines Corporation, Armonk, NY (US)

(72) Inventors: Paul A. Bunce, Poughkeepsie, NY (US); John D. Davis, Wallkill, NY (US); Diana M. Henderson, Poughkeepsie, NY (US); Jigar J. Vora, Westborough, MA (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 13/622,192

(22) Filed: Sep. 18, 2012

(65) Prior Publication Data
US 2014/0078833 A1   Mar. 20, 2014

(51) Int. Cl.
G11C 7/10    (2006.01)

(52) U.S. Cl.
CPC .................... G11C 7/1006 (2013.01)
USPC ............ 365/189.02; 365/185.17; 365/189.04; 365/189.19; 365/230.03; 365/51

(58) Field of Classification Search
CPC .............. G11C 7/18; G11C 8/12; G11C 8/14; G11C 7/12; G11C 7/10
USPC ............. 365/185.17, 189.02, 189.04, 189.19, 365/230.03, 51
See application file for complete search history.

(56) References Cited

U.S. PATENT DOCUMENTS

| 5,917,744 | A  | 6/1999  | Kirihata et al. |
| 6,178,134 | B1 | 1/2001  | Evans et al. |
| 6,335,896 | B1 | 1/2002  | Wahlstrom |
| 6,615,167 | B1 | 9/2003  | Devins et al. |
| 6,807,124 | B2 | 10/2004 | Tsuda et al. |
| 6,810,494 | B2 | 10/2004 | Weinberg et al. |
| 7,203,123 | B2 | 4/2007  | Pochmuller |
| 7,203,928 | B2 | 4/2007  | Mandava et al. |
| 7,280,401 | B2 | 10/2007 | Di Gregorio |
| 7,457,989 | B2 | 11/2008 | Ulrich et al. |
| 7,823,132 | B2 | 10/2010 | Ulrich et al. |
| 8,151,247 | B2 | 4/2012  | Wefers |
| 2003/0097650 | A1 | 5/2003 | Bahrs et al. |
| 2006/0010426 | A1 | 1/2006 | Lewis et al. |
| 2008/0282231 | A1 | 11/2008 | R et al. |
| 2008/0291767 | A1 | 11/2008 | Barnes et al. |
| 2011/0026348 | A1 | 2/2011 | Narui |
| 2012/0262994 | A1* | 10/2012 | Sutardja et al. .......... 365/189.02 |

FOREIGN PATENT DOCUMENTS

WO     2011028343 A3    3/2011

* cited by examiner

*Primary Examiner* — Thong Q Le
(74) *Attorney, Agent, or Firm* — Cantor Colburn LLP; Margaret McNamara (57) ABSTRACT

A memory apparatus includes a plurality of memory arrays, each memory array including a plurality of memory cells. The apparatus includes a plurality of global bit lines and each one of the global bit lines is connected to a plurality of local bit lines, which are in turn connected to a plurality of memory cells. The apparatus includes a plurality of global bit line (GBL) latches and each GBL latch is located along a separate global bit line to latch a signal along the respective global bit line. The apparatus further includes a plurality of solar bit lines configured to connect the global bit lines to an output latch via a plurality of logic gates.

19 Claims, 5 Drawing Sheets

INCREASING MEMORY OPERATING FREQUENCY

BACKGROUND

The present disclosure relates to increasing memory operating frequency, and in particular to providing a solar bit line and earlier latch points, or dynamic-to-static conversion points, to increase a latch margin of an output latch of a memory array and to reduce the dynamic pulse widths required for memory operations.

As the size of memory circuits continues to decrease, the wiring to and from memory cells continues to decrease in width and thickness and the distance between the wires also decreases. The decrease in width and thickness may result in an increased resistance, and the decrease in distance between wires may result in an increased capacitance along the wire. The resistances and capacitances may generate a delay along the wiring, particularly when memory cells farthest from an output line are accessed.

In addition, individual devices that make up arrays of memory cells and the supporting logic circuitry may suffer from signal loss between a memory cell array and an output signal line. To read data from a memory cell device, a pulse of a predetermined width may be applied to a word line, resulting in a corresponding pulse to be output from a desired memory cell. The pulse may propagate along a local bit line connected to a plurality of memory cells and a global bit line connected to a plurality of local bit lines through local evaluation logic. The resulting pulse may need to be detected and latched in a particular window, such as an output latch window, or a time that an output latch is asserted to latch a signal from the memory cells arrays.

However, with each level of signal propagation, such as from the word line through the transistors of the memory cell, from the memory cell to the local bit line, and from the local bit line to a global bit line via a logic gate, the pulse may shrink due to variable electrical characteristics of the circuitry. For example, a switching delay of a transistor in a memory cell and subsequent logic may decrease or delay the switching of the leading edge of the pulse, and a pre-charge circuit connected to a global bit line may cause a premature switching of a trailing edge of the pulse. Accordingly, the delays caused by circuit design characteristics and the pulse distortion due to circuit elements may result in a pulse along a global bit line having a narrower width than the word line pulse, and if the shrunken pulse is too narrow and/or if the delay is too great, the output latch of the memory circuit may not be able to latch the asserted state of the pulse. The nominal pulses associated with memory operations must be designed wide enough to account for data propagation variations and pulse distortion in order to reliably perform operations, such as reading the memory cell array. The widths of these dynamic signals may limit the data processing frequency of the memory.

SUMMARY

Embodiments of the disclosure relate to a memory apparatus including a plurality of memory arrays. Each memory array includes a plurality of memory cells. The apparatus includes a plurality of local bit lines, and each local bit line is connected to a separate plurality of the memory cells. The apparatus includes a plurality of global bit lines, and each global bit line is connected to a separate plurality of the local bit lines. The apparatus includes a plurality of global bit line (GBL) latches, and each GBL latch is located along a separate global bit line to latch a signal along the respective global bit line. The apparatus also includes a plurality of first logic gates, and each first logic gate receives as inputs a separate plurality of the global bit lines. The apparatus also includes a plurality of solar bit lines, and each solar bit line is configured to connect an output of a separate one of the plurality of first logic gates with a same output latch.

Embodiments of the disclosure also relate to a computing device including memory and a processor configured to control the memory to read data from the memory. The memory includes a plurality of global bit lines, each connected to a separate plurality of local bit lines, each of the local bit lines connected to a separate plurality of memory cells. The memory also includes a plurality of global bit line (GBL) latches, and each GBL latch is located along a separate global bit line to latch a signal along the respective global bit line. The memory also includes a plurality of first logic gates, and each first logic gate receives as inputs a separate plurality of the global bit lines. The memory also includes a plurality of solar bit lines, and each solar bit line is configured to connect an output of a separate one of the plurality of first logic gates with a same output latch.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

In memory devices including memory cell arrays, pulse signals corresponding to data read from the memory cell arrays may be distorted and delayed due to switching characteristics of memory cells, latches, and logic circuits and width, thickness and spacing characteristics of wiring. Embodiments of the present disclosure relate to memory devices that latch data of memory cells and transmit the latched data to solar bit lines having shortened lengths, where solar bit lines are defined as bit lines one level above global bit lines in a hierarchy of bit lines.

Figure 1:
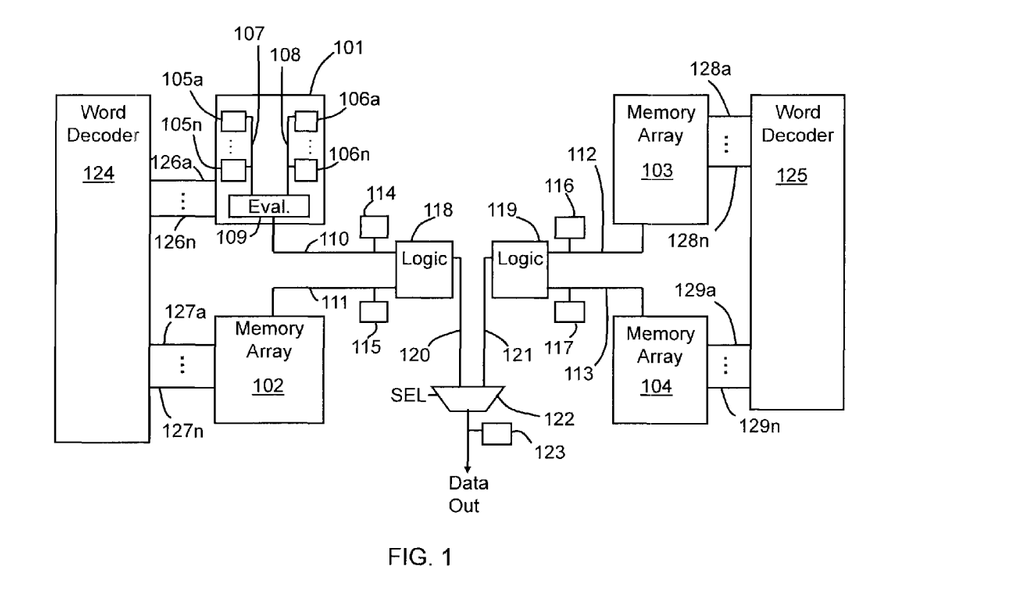
FIG. 1 illustrates a memory apparatus according to an embodiment of the disclosure.

FIG. 1 illustrates a memory apparatus 100 according to an embodiment of the present disclosure. The memory apparatus 100 includes memory arrays 101, 102, 103 and 104. Each memory array includes a plurality of memory cells 105*a* to 105*n* connected to a first local bit line 107 and a plurality of memory cells 106*a* to 106*n* connected to a second local bit line 108. While FIG. 1 illustrates two columns of memory cells 105a to 105n and 106a to 106n for purposes of description, embodiments of the present disclosure encompass any number of memory cells and any number of local bit lines.

Figure 5:
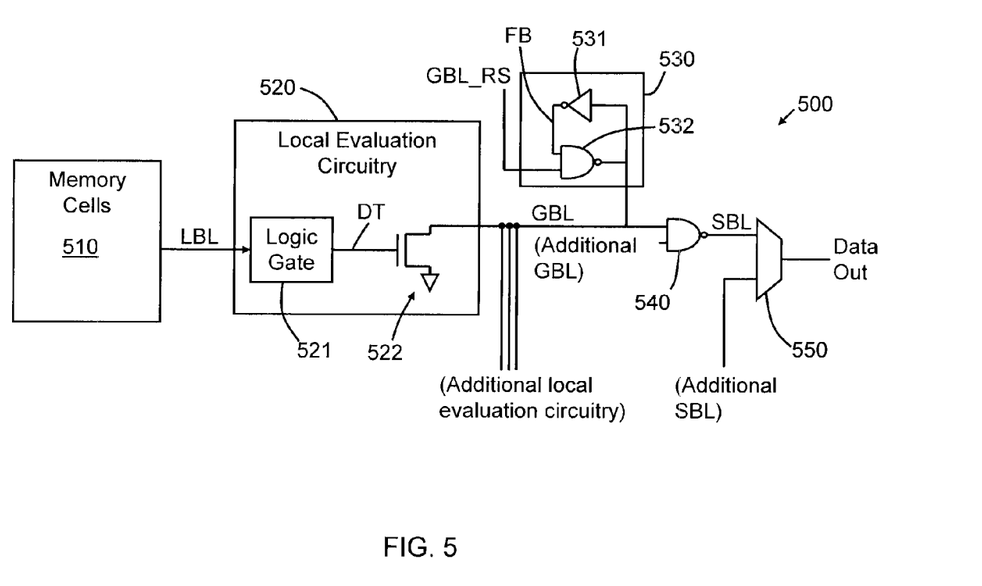
FIG. 5 illustrates a memory circuit according to the embodiment of the disclosure.

The local bit lines 107 and 108 are connected as inputs to evaluation circuitry 109. The evaluation circuitry 109 may include a logic gate and may also include biasing circuitry, such as pull-up or pull-down circuitry to bias the local bit lines 107 and 108 in either a pull-up or pull-down state. The output of the evaluation circuitry 109 is coupled to a global bit line 110. Each memory array 101, 102, 103 and 104 includes at least one global bit line 110, 111, 112 and 113, respectively, as an output to indicate a state of the memory cells in each respective array 101, 102, 103 and 104. Although one evaluation circuitry 109 is illustrated in FIG. 1 as being connected to each global bit line 110, 111, 112 and 113, embodiments of the present disclosure encompass any number of evaluation circuitry connected to each global bit line 110, 111, 112 and 113 (as illustrated in FIG. 5).

Latches 114, 115, 116 and 117 are located along the global bit lines 110, 111, 112 and 113, respectively. The latches 114 to 117 perform dynamic to static conversion by latching the output signals from the memory arrays 101 to 104. Logic gates 118 and 119 each receive output signals from the global bit lines 110 to 113. In particular, a total number of memory arrays is divided, and each global bit line outputs a signal corresponding to one of the divisions of memory arrays. In one embodiment, the global bit lines 110 to 113 are pre-charged or biased at a high voltage and an output signal from a memory array corresponding to data in the memory array drives a corresponding global bit line low, resulting in a high output from the logic gate 118 or 119.

Solar bit lines 120 and 121 are output from the logic gates 118 and 119, respectively. The solar bit lines 120 and 121 may be input to a multiplexer (MUX) 122 or other selection circuitry based on memory that is desired to be read by a control circuit. In the embodiment of FIG. 1 in which a MUX 122 is used as selection circuitry, a selection signal SEL may be provided from a control circuit. The output from the MUX 122 may be latched at a data output latch 123.

In operation, a control circuit (not shown) may control word decoders 124 and 125 to output signals to one of word lines 126a to 126n and 127a to 127n, and to one of word lines 128a to 128n and 129a to 129n to detect data stored in the memory arrays 101 to 104, respectively. The word lines 126 to 129 may turn on transistors in memory cells of the arrays 101 to 104, or may enable the output of data from the memory cells to local bit lines and the global bit lines 110 to 113. Some memory cells may output data slower than other memory cells when activated. For example, a memory cell of the array 101 may output data slower than a memory cell of the array 103 due to wiring characteristics, transistor characteristics, pre-charge circuit characteristics, or other electrical characteristics. The latches 114 to 117 may ensure that, even when some output signals are delayed more than others, the output signal is maintained for a predetermined period of time. Based on the memory that the control circuit desires to access, the control circuit may supply a select signal SEL to control an output of the MUX 122.

Figure 2:
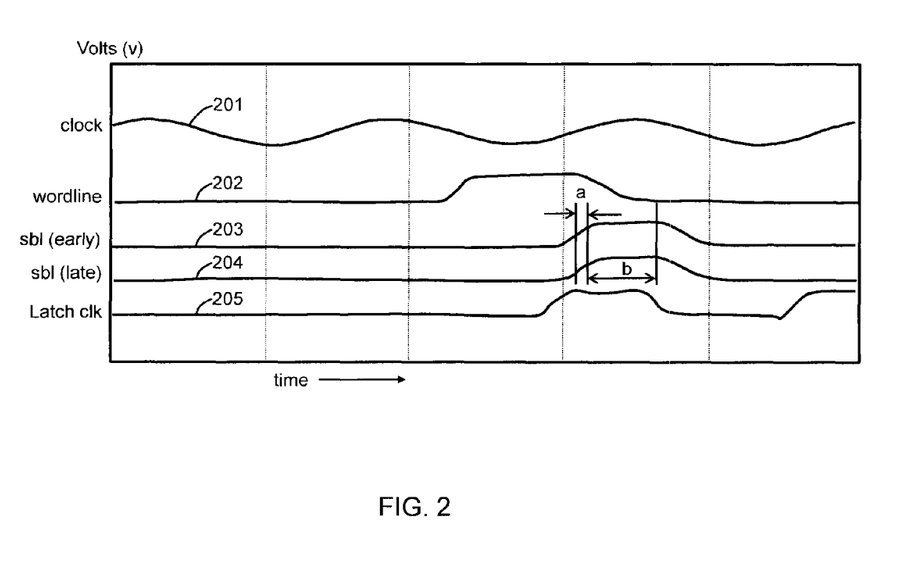
FIG. 2 illustrates a timing diagram according to one embodiment.

In embodiments of the present disclosure, providing solar bit lines 120 and 121 between the global bit lines 110 to 113 and the MUX 122 improves switching slew rates, tolerates pulse width variation and improves an operating frequency of the memory apparatus 100. FIG. 2 illustrates a graph of signals from the solar bit lines 120 and 121 (labeled sbl (early) 203 and sbl (late) 204), indicating that a signal from one of the solar bit lines 120 and 121 is delayed with respect to the other.

In operation, a clock 201 runs at a predetermined frequency and latching operations of the output latch 123, for example, may be performed based on the predetermined frequency. A word line signal 202 is generated to read data from a memory array among a plurality of memory arrays 101 to 104. The word line signal 202 may generate an output from each of the solar bit lines 120 and 121 and a desired memory may be selected by the MUX 122.

For purposes of description only, it is assumed that the solar bit line 120 corresponds to signal 203 and the solar bit line 121 corresponds to the signal 204. The output from latches 114 and 115 cause the logic gate 118 to switch high prior to the logic gate 119. The gap (labeled "a") between the switching of the logic gates is narrow as a result of the latches 114 to 117 and the use of solar bit lines 120 and 121 instead of running global bit lines to the MUX 122. The output latch 125 latch is in an asserted stated as indicated by the signal 205. An interval between the last-received solar bit line (corresponding to solar bit line 121 in this example) and a de-assertion of the latch 123 is the latch margin (indicated as "b" in FIG. 2). In embodiments of the present disclosure, the signal-receiving gap "a" is relatively narrow and the latch margin "b" is relatively wide when contrasted with a memory circuit in which the solar bit lines 120 and 121 are omitted and the global bit lines 110 to 113 are connected directly to the MUX 122. In addition, the asserted states of the solar bit lines 203 and 204 are stable relative to a memory circuit in which the latches 114 to 117 are omitted.

In embodiments of the present disclosure, the switching frequency and latch margin may be improved by locating the MUX122 at a geographic center of a plurality of memory arrays 101 to 104. For example, wiring and circuit characteristics in the arrays 101 to 104, local bit lines, global bit lines 110 to 114 latches 114 to 117, logic gates 118 and 119 and pre-charge circuitry (not shown) may cause signal delays or signal distortion, such as narrowing of pulse widths. In an example in which each memory array corresponds to a predetermined amount of memory, such as 256 memory cells, a slew rate of a global bit line connected to the memory array may be relatively slow and pulse width variations may occur. In embodiments of the present disclosure, a MUX 122 may be located geographically substantially at a center between memory arrays, each comprising 128 memory cells, and the MUX 122 may be connected to the memory cells via the solar bit lines 120 and 121.

Figure 3:
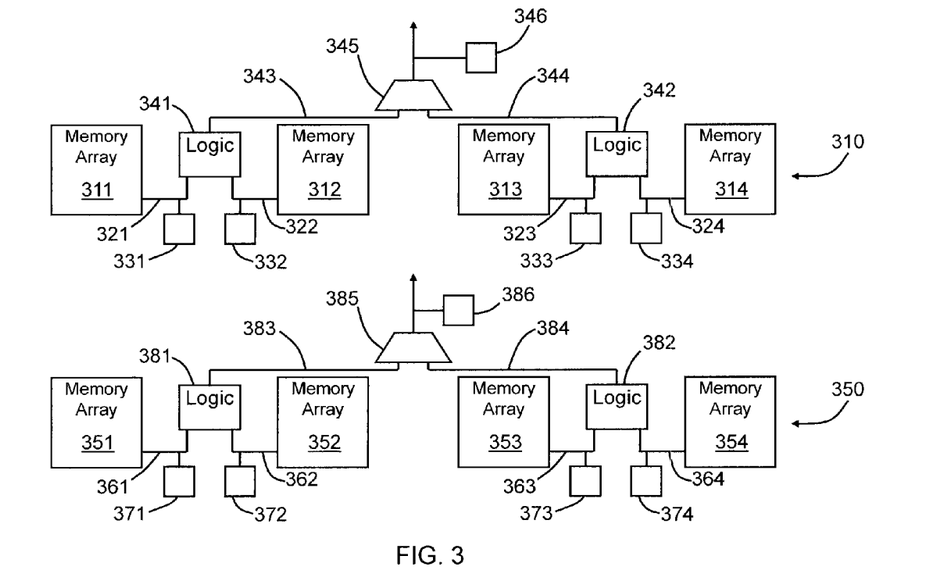
FIG. 3 illustrates a memory circuit according to one embodiment.

FIG. 3 illustrates an example of a memory circuit 300 comprising multiple rows 310 and 350 of memory arrays. The memory arrays 311 to 314 and 351 to 354, as well as the additional circuitry of FIG. 3 may correspond to the elements described in FIG. 1. A first row 310 of memory cells includes memory arrays 311 and 312, each corresponding to 128 memory cells. Global bit lines 321 and 322 connect the memory arrays 311 and 312 to a solar bit line 343 via logic gate 341. Similarly, memory arrays 313 and 314 each correspond to 128 memory cells. Global bit lines 323 and 324 connect the memory arrays 313 and 314 to a solar bit line 348 via logic gate 342. In one embodiment, the solar bit lines 343 and 344 are approximately a same length. In other words, the MUX 345 may be located approximately at a center between the logic gates 341 and 342. The MUX 345 may output a signal to the output latch 346.

The row 350 has a same configuration as the row 310. Memory arrays 351 to 354 each correspond to 128 memory cells. Global bit lines 361 to 364 connect the memory arrays 351 to 354 to solar bit lines 383 and 384 via logic gates 381 and 382. In one embodiment, the solar bit lines 383 and 384 are approximately a same length. In other words, the MUX 385 may be located approximately at a center between the logic gates 381 and 382. The MUX 385 may output a signal to the output latch 386.

By locating a MUX 345 geographically between the logic gates 341 and 342, two short solar bit lines 343 and 344 may transmit signals to the MUX 345, improving a signal transmission frequency of the circuit 300. In addition, by locating the MUX 345 geographically at an approximately center position between the logic gates 341 and 342, a signal transmission gap from the respective memory arrays 311 to 314 to the MUX 345 may be reduced.

While FIG. 3 has been described with respect to 128-memory-cell arrays 311 to 314 and 351 to 354, embodiments of the present disclosure encompass memory arrays of any size. For example, embodiments may correspond to memory cell arrays having a number of memory cells of 128 or greater, such as 128, 256, 512 or 1024 memory cells. In particular, in embodiments of the present disclosure, memory arrays that would normally be connected to one global bit line may be divided equally between two global bit lines, each having a latch. The global bit lines may be connected to a solar bit line via a logic gate, and the solar bit line may be connected to a MUX or other memory array selection circuitry configured to select a group of memory arrays from which a signal will be read.

Embodiments of the present disclosure encompass any number of memory cells per array, any number of memory arrays, any number of rows of memory arrays, and any number of corresponding global bit lines and solar bit lines. Embodiments of the present disclosure may be implemented in two dimensions, such as along substantially a same plane of a substrate, or in three dimensions. For example, global and/or solar bit lines may extend vertically through a substrate and/or horizontally across or through the substrate.

By providing multiple shorter solar bit lines connected to a MUX and output latch, instead of one longer global bit line, a resistance along the lines may be decreased relative to a single longer global bit line. For example, in tests in which two 128-memory-cell arrays were connected to the output latch by two global bit lines connected to a single solar bit line, a delay between a time that a word line signal was asserted and a time that an asserted state of the solar bit line was detected by the output latch was less than a delay when one global bit line connected to a 256-memory-cell array was connected to the MUX and output latch. In other words, even though adding hierarchal layers in a memory system typically results in the potential to distort an output pulse, such as by shrinking a size of the output pulse as the rising edges of the pulse are delayed and the falling edges are advanced, when additional circuit elements were introduced between the memory arrays and the output latch (such as the global bit line latches and gate logic) according to embodiments of the present disclosure, the delay of the memory apparatus including the solar bit lines was still shorter than a delay in a memory apparatus that omitted the solar bit line and included only the global bit line connected to the output latch.

Embodiments of the present disclosure including a latch connected to a global bit line having a length shorter than a global bit line that does not feed into a solar bit line experience an improved latch margin relative to devices that do not include the solar bit line. In particular, devices having a latch connected to a long global bit line that does not feed into a solar bit line may have a latch margin that begins at the falling edge of a feedback node of the latch and ends at a rising edge of the global bit line. However, in embodiments of the present disclosure, the latch margin may extend from a switch from a de-asserted state of a feedback node of the latch to an asserted state to a switch from an asserted state of a data true (DT) signal output from local evaluation circuitry of local bit lines to a de-asserted state of the DT signal. For example, the latch margin may extend from a rising edge of the feedback node to a falling edge of the DT signal. FIG. 2 illustrates a latch margin generated according to an embodiment of the present disclosure. FIG. 5 illustrates an example of circuitry for generating the latch margin.

In particular, FIG. 5 illustrates a memory circuit 500 including memory cells 510, which may correspond to a memory array of FIG. 1, for example. The memory cells 510 output signals to local evaluation circuitry 520, which may include one or more logic gates 521, such as the logic gate 109 of FIG. 1. The local evaluation circuitry 520 may also include a biasing transistor 522, such as the pull-down field-effect transistor (FET) 522 illustrated in FIG. 5. The output of the logic gate 521 of the local evaluation circuitry 520 to drive any biasing circuitry 522 to drive the global bit line GBL is defined as a data true (DT) signal.

A latch 530 is connected to the global bit line GBL. The latch 530 may include one or more inverters 531, or, as illustrated in FIG. 5, an inverter 531 and a logic gate 532 connected end-to-end. The back end of the one or more inverters 531 or the combination of inverter 531 and logic gate 532 is defined as a feedback (FB) signal. In one embodiment, a signal may be input to the logic gate 532, such as a global bit line reset (GBL_RS) signal. The GBL may be connected to a logic gate 540 which drives a solar bit line SBL, which may in turn be connected to a MUX 550 to output a data signal. The latch 530, logic 540 and MUX 550 may correspond to the latches 114-117, logic 118 and 119 and MUX 122 of FIG. 1, for example.

According to embodiments of the present disclosure, when a memory control circuit activates one or more memory cells 510 to read data from the memory cells, the data may be latched by an output latch, such as the latch 123 of FIG. 1, from a rising edge of the feedback node FB of the latch 530 to a falling edge of a data true (DT) signal.

Figure 4:
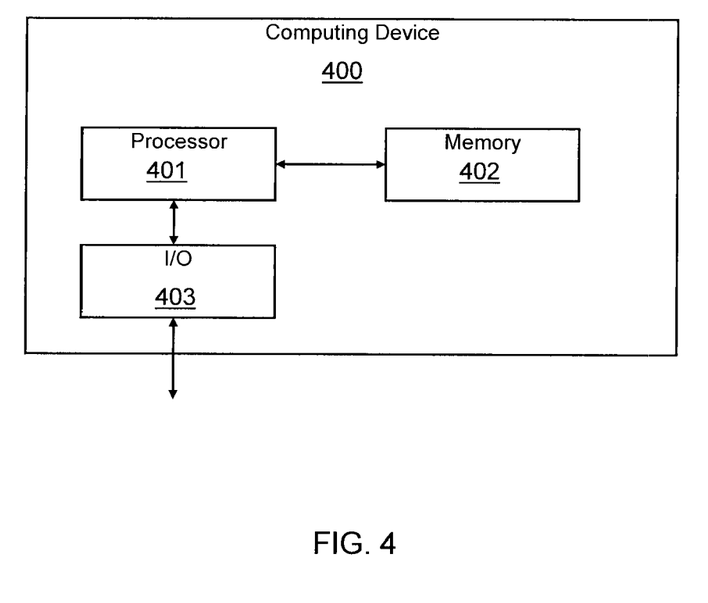
FIG. 4 illustrates a computing device according to an embodiment of the disclosure.

A memory apparatus 100 or memory circuit 300 of FIGS. 1 and 3 may be implemented in any device requiring access to memory. FIG. 4 illustrates a block diagram of one computing device 400 according to an embodiment of the present disclosure. The computing device 400 includes a processor 401 and memory 402. The computing device 400 may further include an input/output (I/O) module 403 for communicating with external devices. The memory 402 may include the memory apparatus 100 or memory circuit 300 described above. The processor 401 may control access to the memory 402 to write data to the memory 402 and/or read data from the memory 402 according to operations of the computing device 400, which may include signal or data generation, analysis and/or storage, display functions, signal processing functions, calculation functions, etc. The memory 402 may be any type of memory, including cache memory, static random access memory (SRAM), or any other type of memory. Example computing devices 400 include controllers for personal computers, servers, mainframes, portable media devices, handheld electrical communications devices, portable or stationary data storage devices, or any other type of computing or storage devices.

While embodiments of the present disclosure have been described with respect to a three-level data access structure (i.e. local bit line, global bit line, solar bit line), embodiments of the present disclosure may encompass any number of levels, according to design constraints of a circuit. For example, multiple solar bit lines may connect to a single galaxial bit line, and multiple galaxial bit lines may connect to a single universal bit line, etc. In other words, embodiments of the present disclosure encompass any number of hierarchal levels, any one of the levels including latches to latch data, and an output latch at an output of the entire hierarchal structure. In one embodiment, only one of the levels of bit lines (among a local bit lines, global bit lines, galaxial bit lines, and universal bit lines) includes a latch. In one embodiment, only the global bit lines include latches, regardless of a number of subsequent hierarchal levels. In one embodiment, the hierarchal structure is configured to have a number of hierarchal levels to maintain a size of memory arrays constant. For example, in one embodiment, an ideal size of a memory array is 128 memory cells, and the number of levels in the hierarchy is determined by a total desired size of the memory divided into 128-memory-cell array segments. In embodiments in which additional hierarchal levels are provided in addition to the solar bit lines, additional MUXes, gate logic, and/or other memory cell selection circuitry may also be provided.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. Embodiments were chosen and described in order to best explain the principles of the disclosure and the practical application, and to enable others of ordinary skill in the art to understand the disclosure for various embodiments with various modifications as are suited to the particular use contemplated.

While embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A memory apparatus, comprising:
   a plurality of memory arrays, each memory array comprising a plurality of memory cells;
   a plurality of local bit lines (LBLs), each connected to a separate plurality of the memory cells;
   a plurality of global bit lines, each connected to a separate plurality of the local bit lines;
   a plurality of global bit line (GBL) latches, each located along a separate global bit line to latch a signal along the respective global bit line;
   a plurality of first logic gates, each receiving as inputs a separate plurality of the global bit lines; and
   a plurality of solar bit lines, each configured to connect an output of a separate one of the plurality of first logic gates with a same output latch.

2. The memory apparatus of claim 1, wherein the plurality of first logic gates are NAND gates.

3. The memory apparatus of claim 1, further comprising a multiplexer between the plurality of solar bit lines and the output latch.

4. The memory apparatus of claim 1, wherein each of the plurality of memory arrays comprises 128 memory cells.

5. The memory apparatus of claim 1, wherein each of the plurality of first logic gates is located geographically between two memory arrays of the plurality of memory arrays, and
   the first logic gate between the two memory arrays receives as inputs the global bit lines corresponding to the two memory arrays.

6. The memory apparatus of claim 1, wherein the output latch is located geographically at a center between two of the plurality of first logic gates, each of the two first logic gates receiving as inputs a same number of global bit lines corresponding to a same number of memory arrays.

7. The memory apparatus of claim 1, further comprising a plurality of second logic gates, each second logic gate having as inputs a plurality of local bit lines and having as an output one of the plurality of global bit lines.

8. The memory apparatus of claim 1, wherein each of the plurality of global bit lines is connected to a GBL latch, and each of the plurality of local bit lines is connected to LBL evaluation logic.

9. The memory apparatus of claim 8, wherein a latch margin of the output latch is defined by a duration beginning when a feedback node of the GBL latch switches from a de-asserted state to an asserted state and ending when an output of the LBL evaluation logic switches from an asserted state to a de-asserted state.

10. A computing device, comprising:
    memory; and
    a processor configured to control the memory to read data from the memory,
    wherein the memory comprises:
    a plurality of global bit lines, each connected to a separate plurality of local bit lines (LBLs), each of the local bit lines connected to a separate plurality of memory cells;
    a plurality of global bit line (GBL) latches, each located along a separate global bit line to latch a signal along the respective global bit line;
    a plurality of first logic gates, each receiving as inputs a separate plurality of the global bit lines; and
    a plurality of solar bit lines, each configured to connect an output of a separate one of the plurality of first logic gates with a same output latch.

11. The computing device of claim 10, wherein the plurality of first logic gates are NAND gates.

12. The computing device of claim 10, further comprising a multiplexer between the plurality of solar bit lines and the output latch.

13. The computing device of claim 10, wherein each of the plurality of memory arrays comprises 128 memory cells.

14. The computing device of claim 10, wherein each of the plurality of first logic gates is located geographically between two memory arrays of the plurality of memory arrays, and
    the first logic gate between the two memory arrays receives as inputs the global bit lines corresponding to the two memory arrays.

15. The computing device of claim 10, wherein the output latch is located geographically at a center between two of the plurality of first logic gates, each of the two first logic gates receiving as inputs a same number of global bit lines corresponding to a same number of memory arrays.

16. The computing device of claim 10, further comprising a plurality of second logic gates, each second logic gate having as inputs a plurality of local bit lines and having as an output one of the plurality of global bit lines.

17. The computing device of claim 10, further comprising a word decoder, the processor configured to control the word decoder to output a word line pulse to access a particular memory cell from among the plurality of memory cells.

18. The computing device of claim 10, wherein each of the plurality of global bit lines is connected to a GBL latch, and each of the plurality of local bit lines is connected to LBL evaluation logic.

19. The computing device of claim 18, wherein a latch margin of the output latch is defined by a duration beginning when a feedback node of the GBL latch switches from a de-asserted state to an asserted state and ending when an output of the LBL evaluation logic switches from an asserted state to a de-asserted state.

* * * * *